(12) United States Patent
Masuo et al.

(10) Patent No.: US 6,384,360 B1
(45) Date of Patent: *May 7, 2002

(54) IC PICKUP, IC CARRIER AND IC TESTING APPARATUS USING THE SAME

(75) Inventors: Yoshiyuki Masuo; Yoshihito Kobayashi, both of Tokyo (JP)

(73) Assignee: Advantest Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/330,151

(22) Filed: Jun. 11, 1999

(30) Foreign Application Priority Data

Jun. 15, 1998 (JP) .......................... 10-166880

(51) Int. Cl.[7] ............................... B25J 15/06

(52) U.S. Cl. ...................................... 209/573; 294/64.1

(58) Field of Search .................... 294/64.1; 414/226.01, 414/222.13, 222.05, 222.01

(56) References Cited

U.S. PATENT DOCUMENTS

| | | | | | |
|---|---|---|---|---|---|
| 5,795,001 | A | * | 8/1998 | Burke | 294/64.1 |
| 5,865,319 | A | * | 2/1999 | Okuda et al. | 209/574 |
| 5,961,168 | A | * | 10/1999 | Kanno | 294/64.1 |
| 6,024,392 | A | * | 2/2000 | Blatt | 294/64.1 |

* cited by examiner

*Primary Examiner*—Donald P. Walsh
*Assistant Examiner*—Jonathan R Miller
(74) *Attorney, Agent, or Firm*—Birch, Stewart, Kolasch & Birch, LLP

(57) ABSTRACT

A pad 1051, air cylinder 1052, cylinder control valve 1053, vacuum generator 1054, feed valve 1055, break valve 1056, and pressure sensor 1057 are assembled together to form an IC pickup 105*d*.

15 Claims, 6 Drawing Sheets

IC PICKUP, IC CARRIER AND IC TESTING APPARATUS USING THE SAME

BACKGROUND OF THE INVENTION

1. Field of the Invention

The present invention relates to an IC pickup preferable for use for an IC testing apparatus for testing semiconductor integrated circuit devices and other various electronic components (hereinafter referred to as "ICs" representatively) and an IC carrier and IC testing apparatus using the same, more particularly relates to a compact IC pickup superior in operating response and an IC carrier and IC testing apparatus using the same.

2. Description of the Related Art

An IC testing apparatus called a "handler" conveys a large number of ICs held on a tray to the inside of the handler. There, the ICs are made to electrically contact a test head, then an IC tester unit (hereinafter referred to as a "tester") is made to perform the test. When the test is ended, the ICs are conveyed from the test head and reloaded on trays in accordance with the results of the tests so as to sort them into categories of good ICs and defective ones.

Some conventional handlers are of a type provided with, in addition to trays for holding the ICs to be tested or the tested ICs (hereinafter referred to the "customer trays"), trays conveyed circulated inside the handler (hereinafter referred to as the "test trays"). In this type of handler, the ICs are reloaded between the customer trays and the test trays before and after the test.

The handler is provided with IC pickups for transferring ICs between the trays and pushing the ICs against the test head. A conventional IC pickup is comprised by a suction pad for picking up an IC by suction, a vacuum generator for impacting a suction force to the pickup pad, a control valve for controlling the ON/OFF state of the suction force by the vacuum generator, an actuator for making the pickup pad move up and down (for example, an air cylinder), and a control valve for driving the actuator.

In such a conventional IC pickup, however, the actuator having the suction pad attached to its front end was for example provided at the base of the X-Y conveyor of the handler, the control valve for driving the actuator was provided at a location other than at the base, and the vacuum generator and control valve were provided at still other locations, so a hose connecting the actuator and control valve and a hose connecting the suction pad and vacuum generator were necessary. Therefore, the distance between the drive and the control valve inevitably became longer and there was a problem in the response to a control signal.

Further, depending on the mounting positions of these parts, the arrangement of the hoses for connecting them also became difficult. Since the suction pad and actuator are operated by the X-Y conveyor, a length enabling their range of operation to be covered was necessary.

The present invention was made in consideration with these problems in the prior art and has as its object the provision of an IC pickup with components assembled compactly and superior in operating response and an IC carrier and IC tester using the same.

SUMMARY OF THE INVENTION

It is an object of the present invention to provide an IC pickup with components assembled compactly and superior in operating response and an IC carrier and IC testing apparatus using the same.

(1) According to the present invention, there is provided an IC pickup comprising at least a pad for picking up and holding an electronic component by suction, an actuator for making said pad operate, and a suction control valve for applying and releasing a suction force to and from said pad, wherein said pad, said actuator and said suction control valve are assembled into an integral unit.

With the IC pickup of the present invention, since the pad, actuator, and suction control valve are assembled into an integral unit, by attaching this unit to the base of the XY-conveyor, the IC pickup components can made compact and the hose connecting the pad and the suction control valve can be shortened, so the operating response can be improved.

The "assembly into an integral unit" spoken of in the present invention means not only building the pad, actuator, and suction control valve into a single part, but also joining these parts using screws or other connecting means. Therefore, when the stroke of motion of the pad differs and the suction force is the same, the pad and actuator may be changed and the same parts used for rest of the IC pickup.

Further, the suction control valve according to the present invention is a control valve for both imparting a suction force to the pad and releasing it and may be configured by a feed valve alone and also may be configured by a feed valve and break valve in combination. When the suction control valve is configured by a feed valve alone, the feed valve is operated when applying the suction force, while the air pressure serving as the source of the suction force is released to the atmosphere when releasing the suction force. As opposed to this, when desiring to improve the speed of pickup and release of an IC or when the IC is relatively light in weight, is possible to add a break valve to forcibly release the suction force.

(2) In the above invention, while not limited to this, a sensor for detecting the suction force of the pad may be further assembled into the integral unit. By assemblying the sensor for detecting the suction force into the integral unit, since the location of detection of the suction force is close to the pad, the accuracy of detection by the sensor becomes higher.

(3) In the above invention, as the suction force generator for imparting a suction force to the pad, it is also possible to use one outside of the pickup, but when providing a suction force generator able to be used for individual pickups or several pickups, it is preferable that a suction force generator be further assembled into the integral unit.

By doing this, the IC pickup components are made more compact and also the hoses and flow paths connecting the suction force generator and pad and the suction force generator and suction control valve can be made shorter and therefore the operating response improved.

(4) In the present invention, the actuator for making the pad move may be either of the electrically driven, electromagnetically driven or fluid pressure type. When using a fluid pressure cylinder, a cylinder control valve for controlling the drive action of the fluid pressure cylinder is preferably further assembled into the integral unit.

When using a fluid pressure cylinder as an actuator, a cylinder control valve for controlling the drive action of the fluid pressure cylinder becomes necessary, but by assembling this into the integral unit, not only can IC pickup components be made compact, but also the hoses and flow paths connecting the fluid pressure cylinder and cylinder control valve can be shortened and the operating response of the fluid pressure cylinder can be further improved.

(5) While not particularly limited to this, when using a fluid pressure cylinder as the actuator, the fluid pressure cylinder is preferably made one of a differential pressure control system such as with the IC pickup set forth in claim 5. By adopting this differential pressure control system, the cylinder control valve becomes more compact and the IC pickup can be made smaller in size.

(6) In the above invention, while not particularly limited to this, the IC pickup set forth in claim 8 is characterized in that at least several electrical signal wires among a plurality of electrical signal wires are connected to a single location.

Since the electrical signal wires for the actuator, suction control valve, sensor, etc. are comprised of a plurality of cables, by connecting these together at a single location, it is possible to share the power wires and as a result reduce the number of wires (number of core wires). In this case, in addition to connecting all of the plurality of electrical signal wires at just a single location, it is also possible to connect just some of the plurality of electrical signal wires together at a single location. If connecting all of the electrical signal wires centrally at a single location, however, it is possible to provide a more compact IC pickup.

(7) In the above invention, while not particularly limited to this, an IC pickup set forth in claim 9 is characterized in that the signal wires for the actuator, suction control valve, and sensor are made internal wiring.

By making the signal wires for the actuator, suction control valve, and sensor internal wiring, it is possible to make the IC pickup components more compact.

(8) In the above invention, while not particularly limited to this, an IC pickup set forth in claim 10 is characterized in that the fluid path with respect to the suction force generator is formed internally. And in the above invention, while not particularly limited to this, an IC pickup set forth in claim 11 is characterized in that the fluid path with respect to the fluid pressure cylinder is formed internally.

As the fluid paths of the suction force generator and fluid pressure cylinder, hoses, pipes, etc. may be used, but by forming the fluid paths inside when assembling the pickup components into an integral unit, the IC pickup components can be made more compact.

(9) The IC pickup of the present invention may also be used as an IC carrier combined with a drive for making the IC pickup move in at least one axial direction and may be used built into an IC testing apparatus conveying an IC to a test head, testing it there, and sorting the IC based on data of the test results.

In this case, the IC pickup of the present invention may be applied to various types of IC testing apparatus such as IC testing apparatus of the chamber type, IC testing apparatus of the heat plate type, IC testing apparatus of the type performing tests in a state with the ICs carried on a test tray, and IC testing apparatus of a type performing the tests while directly holding the ICs by the IC pickup and can be applied to all sorts of IC pickups in IC testing apparatus such as loader sections, unloader sections, or test head sections.

Further scope of the applicability of the present invention will become apparent from the detailed description given hereinafter. However, it should be understood that the detailed description and specific examples, while indicating preferred embodiments of the invention, are given by way of illustrations only, since various changes and modifications within the spirit and scope of the invention will become apparent to those skilled in the art from this detailed description.

BRIEF DESCRIPTION OF THE DRAWINGS

These and other objects and features of the present invention will be explained in more detail below with reference to the attached drawings which are given by way of illustration only, and thus are not limitative of the present invention, and wherein.

DESCRIPTION OF THE PREFERRED EMBODIMENTS

Figure 1:
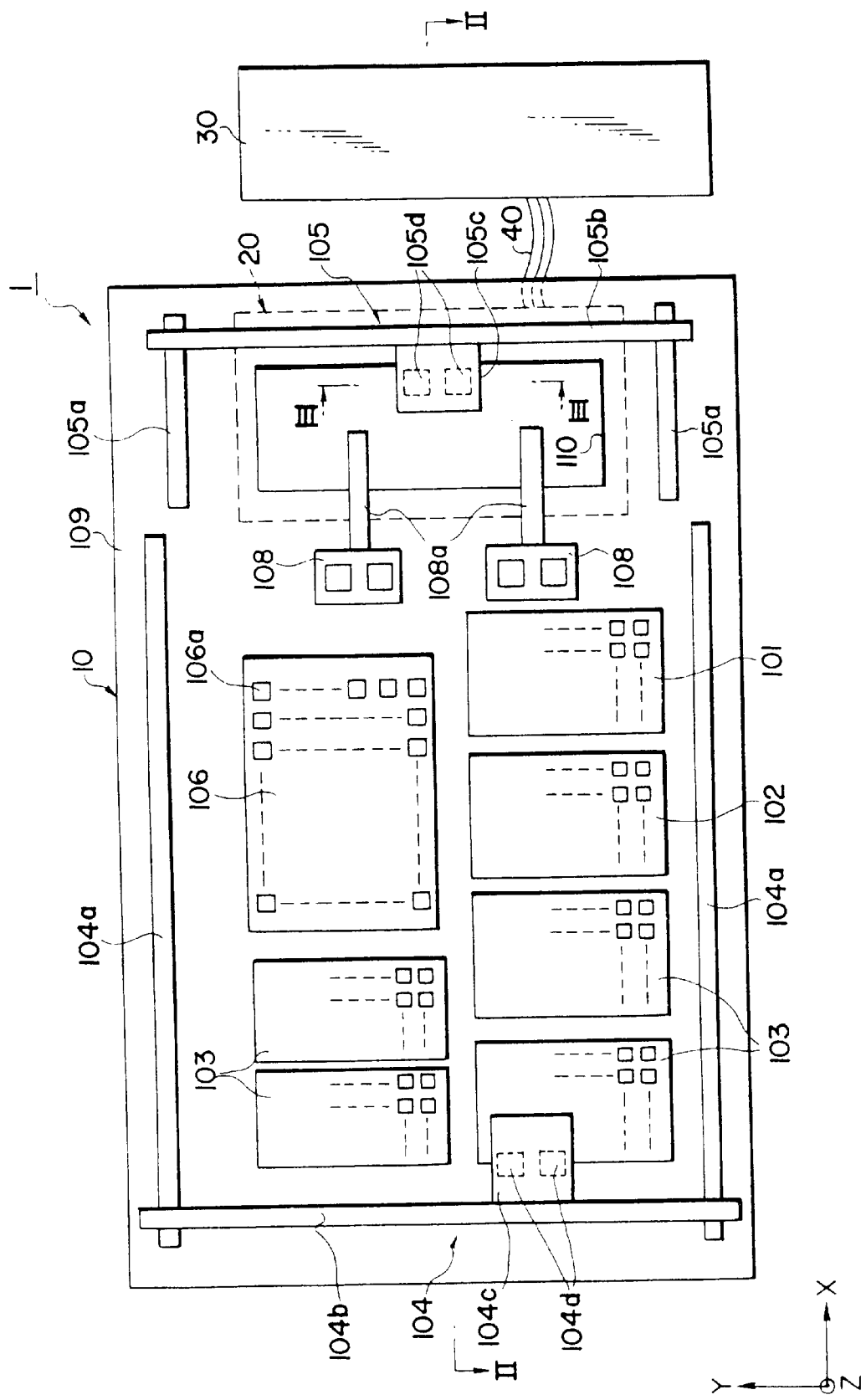
FIG. 1 is a plan view of an embodiment of an IC testing apparatus to which the IC pickup of the present invention is applied.

Embodiments of the present invention will be explained below based on the drawings.

The IC tester 1 is comprised of a handler 10, a test head 20, and a tester 30. The test head 20 and the tester 30 are connected through a cable 40. Pre-test ICs carried on a feed tray 102 of the handler 10 are pushed against the contact portions of the test head 20 by the X-Y conveyors 104, 105. The tests on the ICs are executed through the test head 20 and the cable 40, then the ICs finished being tested are stored on sorting trays 103 in accordance with the test results.

Figure 2:
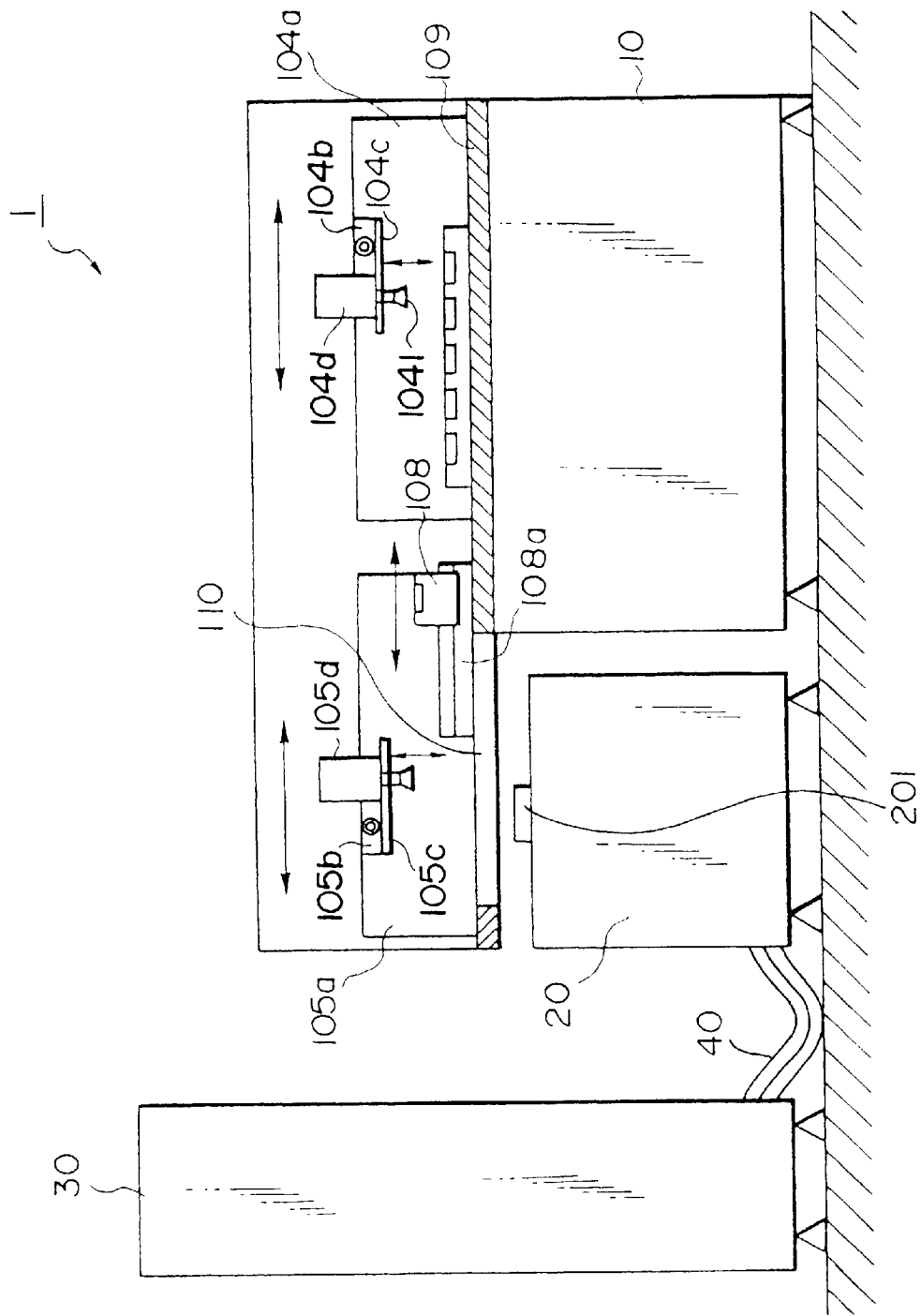
FIG. 2 is a sectional view along the line II—II of FIG. 1.

The handler 10 is provided with a board 109. The X-Y conveyors 104, 105 for the ICs are provided on the board 109d. Further, the board 109 is formed with an opening 110. As shown in FIG. 2, the ICs are pushed through the opening 110 against the contact portions 201 of the test head 20 arranged at the back side of the handler 10.

The two X-Y conveyors 104, 105 are provided on the board 109 of the handler 10. The X-Y conveyor 104 among these is configured to enable an IC pickup 104d mounted on a mounting base 104c to be moved from a sorting tray 103 to the region of the feed tray 102, empty tray 101, heat plate 106, and two buffer sections 108, 108 by rails 104a, 104b provided along the X-direction and the Y-direction. Further, the pad 1041 of the IC pickup 104d is designed to be able to move in the Z-direction, that is, the vertical direction, as well by a not shown Z-actuator (corresponding to air cylinder 1052 shown in FIG. 3). Further, two ICs can be picked up, conveyed, and released at one time by two IC pickups 104d provided on the mounting base 104c.

As opposed to this, the X-Y conveyor 105 is configured to enable an IC pickup 105d mounted on a mounting base 105c to be moved between two buffer sections 108, 108 and a test head 20 by rails 105a, 105b provided along the X-direction and the Y-direction. Further, the pad 1051 of the IC pickup 105d is designed to be able to move in the Z-direction (that is, the vertical direction) as well by an air cylinder (Z-actuator) 1052 shown in FIG. 3. Further, two ICs can be picked up, conveyed, and released at one time by two IC pickups 105d provided on the mounting base 105c.

The two buffer sections 108, 108 move back and forth between the operating regions of the two X-Y conveyors 104, 105 by rails 108a and not shown actuators. The buffer section 108 at the top in FIG. 1 works to transfer an IC conveyed from the heat plate 106 to the test head 20, while the lower buffer section 108 works to eject the IC finished being tested at the test head 20. The provision of these two buffer sections 108, 108 enables the two X-Y conveyors 104, 105 to operate simultaneously without interfering with each other.

In the operating region of the X-Y conveyor 104 are arranged a feed tray 102 on which ICs going to be tested are carried, four sorting trays 103 on which post-test ICs are stored sorted into categories in accordance with the test results, and an empty tray 101. Further, a heat plate 106 is provided at a position in proximity to the buffer sections 108.

The heat plate 106 is for example a metal plate and is formed with a plurality of indentations 106a into which ICs are dropped. A pre-test IC from the feed tray 102 is transferred to an indentation 106a by the X-Y conveyor 104. The heat plate 106 is a heating source for applying a predetermined thermal stress to an IC. The IC is heated to a predetermined temperature by the heat plate 106, then is pushed against a contact portion of the test head 20 through one of the buffer sections 108.

Figure 3:
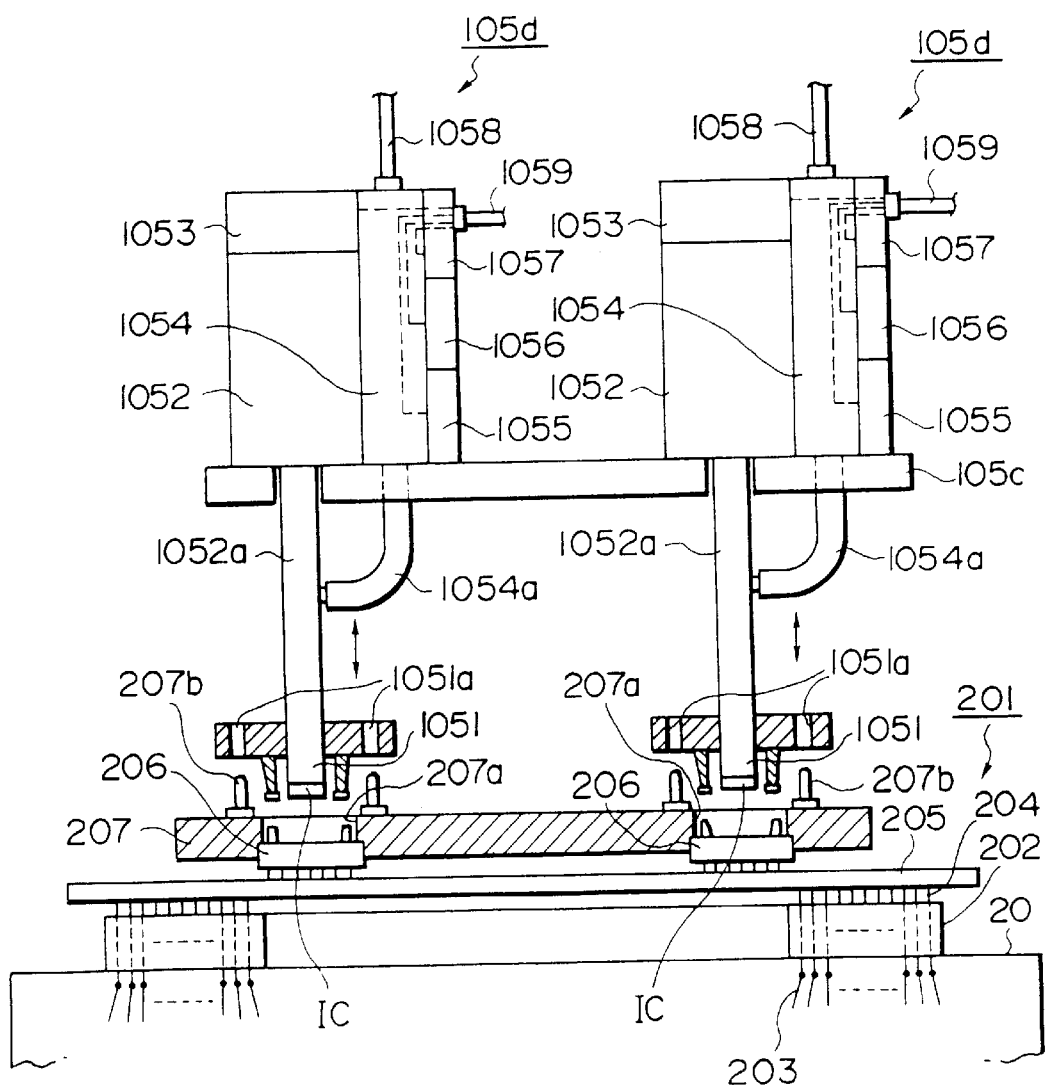
FIG. 3 is a sectional view of details of a contact portion of the test head of FIG. 2 (sectional view along the line III—III of FIG. 1)

As shown in FIG. 3, at the top surface (contact portion 201) of the test head 20 according to the present embodiment is attached a frog ring 202 electrically connected to the test head 20 body through a cable 203. The frog ring 202 has a plurality of pogo pins 204 (contact pins having movable pins supported to be able to advance and retract in the axial direction by springs and biased in a direction where the movable pins project out by the springs) provided facing upward in a ring. A performance board 205 is provided with terminals contacting the pogo pins 204. Further, two IC sockets 206, 206 are mounted to the performance board 205 in an electrically connected state. Due to this, the contact pins (not shown) of the IC sockets 206 are electrically connected to the test head 20 body through the performance board 205, pogo pins 204, frog ring 202, and cable 203.

Figure 4:
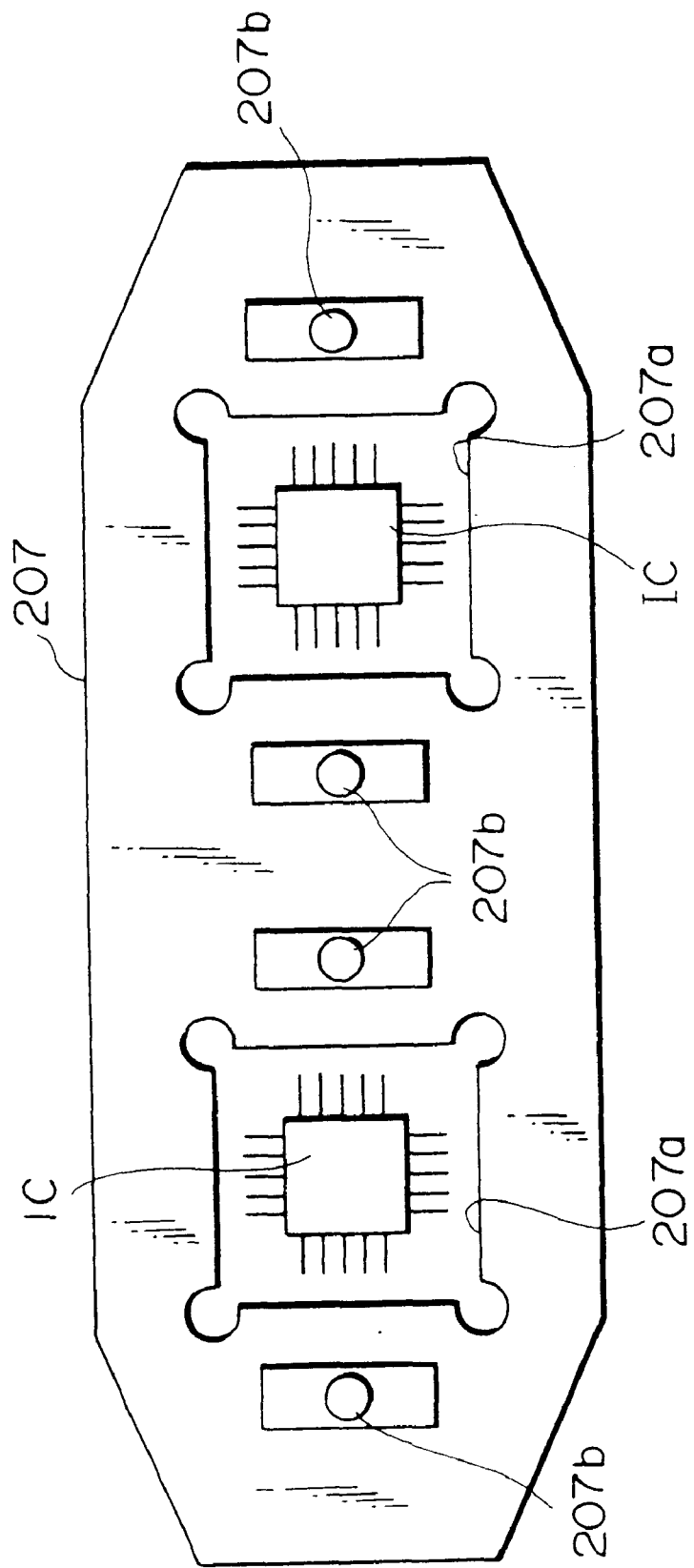
FIG. 4 is a plan view of a socket guide of FIG. 3.

Note that each of the two IC sockets 206 has fitted into it a socket guide 207 having two openings 207a and guide pins 207b as shown in FIG. 4 and that ICs held by the IC pickup 105d are pushed against an IC socket 206 through the openings of the socket guide 207. At this time, the guide pins 207b provided at the socket guides 207 are inserted into the guide holes 1051a formed in the pad 1051 of the IC pickup 105d, whereby the ICs and IC sockets 206 are positioned with respect to each other.

As shown in FIG. 3, an IC pickup 105d according to the present embodiment is configured by an air cylinder 1052 for making a pad 1051 picking up and holding the IC by suction move vertically, cylinder control valve 1053 for controlling the drive action of the air cylinder 1052, vacuum generator 1054 for imparting a suction force to the pad 1051, feed valve and break valve 1056 for controlling the operation of the vacuum generator 1054, and pressure sensor 1057 for detecting the suction force by the vacuum generator 1054 assembled into an integral block-shaped unit.

The vacuum generator which can be used in the present embodiment is an ejector vacuum pump utilizing the so-called ejector effect. It introduces compressed air from a suction chamber into a constricted passage and generates a suction force by the accompanying flow from a suction passage formed there. Therefore, an air hose 1058 through which compressed air from the factory etc. is supplied is connected to the top of the vacuum generator 1054. By introducing compressed air into the vacuum generator 1054 from there, a suction force is generated in the suction hose 1054a connected to the pad 1051 and the IC can be picked up.

Further, the vacuum generator 1054 imparts a suction force to the suction hose 1054a, that is, the pad 1051, by compressed air supplied from the air hose 1058. Therefore, a feed valve 1055 for introducing compressed air from the air hose 1058 to the suction chamber of the vacuum generator 1054 and a break valve 1056 for exhausting the compressed air which had been led into the suction chamber of the vacuum generator 1054 up to then are provided at the side of the vacuum generator 1054. Further, a pressure sensor 1057 for detecting the suction force generated from the vacuum generator 1054 is provided along with these feed valve 1055 and break valve 1056.

On the other hand, the cylinder control valve 1053 for controlling the drive action of the air cylinder 1052 is supplied with part of the compressed air from the air hose 1058, whereby the rod 1052a of the air cylinder 1052 advances or retracts (here, moves vertically). Here, the compressed air from the air hose 1058 is supplied to the above-mentioned vacuum generator 1054 and cylinder control valve 1053, so, while not illustrated, air passages are formed in the block constituted by the vacuum generator 1054 and cylinder control valve 1053.

Figure 5:
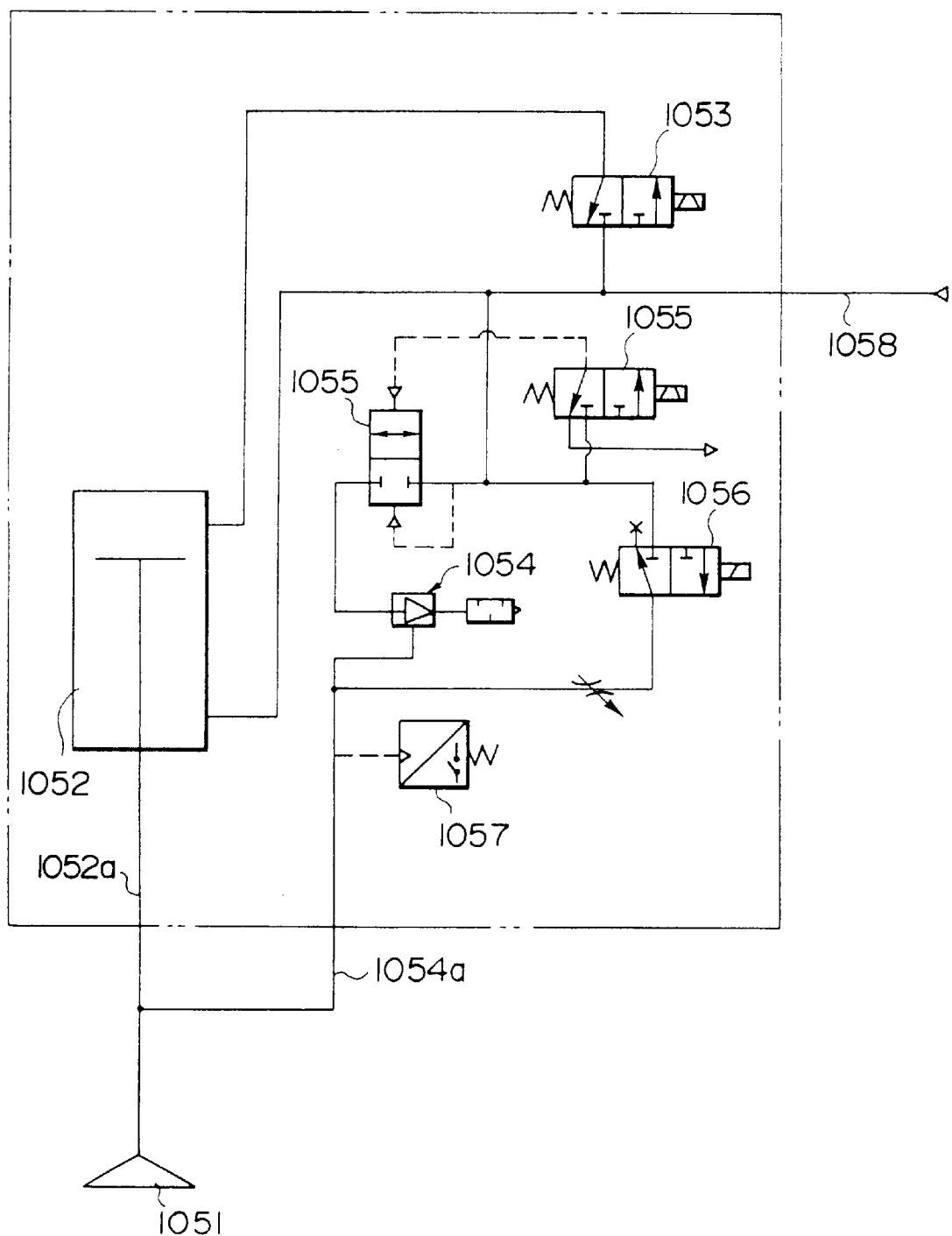
FIG. 5 is a circuit diagram of an embodiment of a pneumatic circuit of the IC pickup of the present invention.

FIG. 5 is a circuit diagram showing the pneumatic circuit of the present embodiment. In the pneumatic circuit shown in the figure, the air cylinder 1052 is made one of a so-called differential pressure control system. This differential pressure control system takes note of the fact that between the front and back faces of the piston of the air cylinder 1052, the face where the rod 1052a is provided has a pressure receiving area smaller than that of the other face by exactly the sectional area of the rod 1052a and makes the rod 1052a advance by introducing compressed air of the same pressure to the front and back faces of the piston.

That is, as shown in the pneumatic circuit of that figure, compressed air is introduced into a port at the rod 1052a side of the piston. Compressed air of the same pressure is introduced into a port at the opposite face of the piston only when making the rod 1052a advance. Due to this, the pressure receiving surface of the opposite face of the piston becomes larger than that of the rod side by exactly the amount of the rod and the total amount of pressure received becomes larger, so the rod 1052a advances. Further, by stopping the introduction of compressed air into the opposite face side of the piston, the rod 1052a retracts due to the introduction of compressed air to the rod side.

By using an air cylinder 1052 of this differential pressure control system, the cylinder control valve 1053 may be made a compact one and therefore the IC pickup of the present embodiment becomes further compact as a whole.

Figure 6:
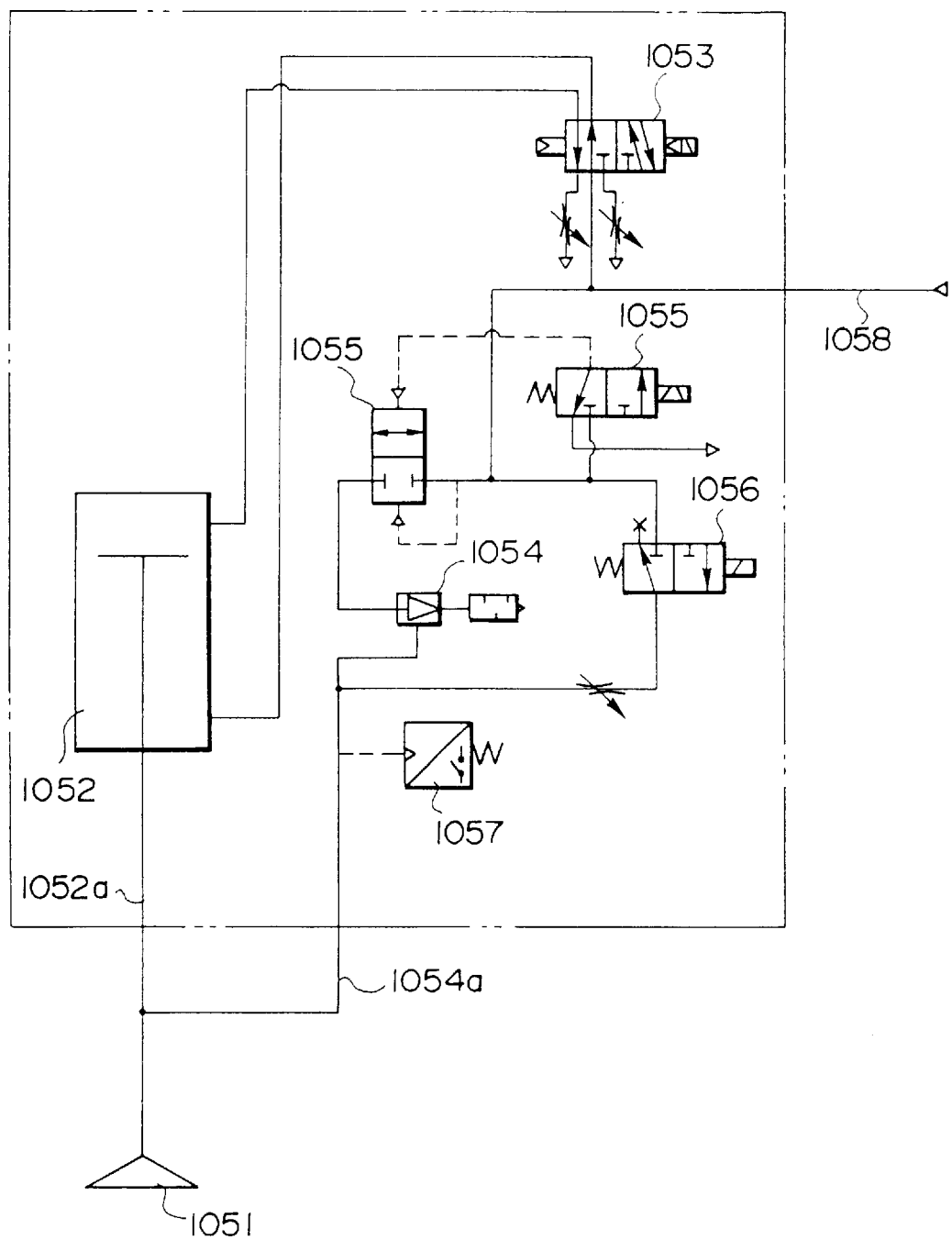
FIG. 6 is a circuit diagram of another embodiment of a pneumatic circuit of the IC pickup of the present invention.

The operational control system for the air cylinder 1052 according to the present invention, however, is not limited to just that shown in FIG. 5. There is no problem at all even if adopting the general operational control system shown in FIG. 6. In FIG. 6, members common with FIG. 5 are given the same reference numerals.

On the other hand, the signal wires to the cylinder control valve 1053, feed valve 1055, and break valve 1056 and the output signal wire 1059 from the pressure sensor 1057 are for example connected to a single location of the IC pickup 105d as illustrated and then made internal wiring in the block. In this case, a printed circuit board can be used for part or all of the internal wiring.

Next, the operation will be explained.

A pre-test IC carried on the feed tray 102 of the handler 10 is picked up and held by the X-Y conveyor 104 and transferred to an indentation 106a of the heat plate 106. By leaving it there for exactly a predetermined time, the IC rises to a predetermined temperature. Therefore, the X-Y conveyor 104 transferring the not yet heated IC from the feed tray 102 to the heat plate 106 releases the IC, then picks up and holds an IC which had been left at the heat plate 106 and had been raised to the predetermined temperature and transfers it to a buffer section 108.

The buffer section 108 to which the IC has been transferred moves to the right end of the rail 108a, is picked up and held by the IC pickup 105d of the X-Y conveyor 105, and, as shown in FIG. 3, is pushed against the IC socket 206 of the test head through the opening 110 of the board 109.

In the IC pickup 105d of this embodiment, since the pad 1051, air cylinder 1052, cylinder control valve 1053, vacuum generator 1054, feed valve 1055, break valve 1056, and pressure sensor 1057 are assembled into an integral block-shaped unit, the IC pickup components are made compact for mounting to the mounting base 105c of the X-Y conveyor 105.

Further, since the distances between the air hose 1058 to which compressed air is fed and the cylinder control valve 1053, the air hose 1058 and vacuum generator 1054, and the vacuum generator 1054 and the pad 1051 can be shortened, the operating response of the air cylinder 1052 and vacuum generator 1054 with respect to a signal input from the signal wire 1059 can be improved.

Further, in the IC pickup 105d of the present embodiment, the pad 1051, air cylinder 1052, cylinder control valve 1053, vacuum generator 1054, feed valve 1055, break valve 1056, and pressure sensor 1057 are screwed together, so when for example desiring to change the stroke of the air cylinder 1052, it is sufficient to change just the air cylinder 1052. The same other components can be used.

Further, since the air hoses and electrical wires are formed internally as much as possible, the IC pickup components can be made more compact by that amount.

Note that the embodiment explained above was described to facilitate the understanding of the present invention and not to limit the present invention. Accordingly, elements disclosed in the above embodiment include all design modifications and equivalents belonging to the technical field of the present invention.

In the above embodiment, the IC pickup of the present invention was used for an X-Y conveyor 105 for the test head 20, but it may also be used for the X-Y conveyor 104 in the IC tester of the above embodiment. Further, the actuator for making the pad 1051 move vertically is not limited to the air cylinder 1052 and may be an actuator having an electrical motor as a drive source. Further, the vacuum generator 1054 is not essential to the IC pickup of the present invention. When there is a vacuum source outside in the factory etc., it is sufficient to provide just a feed valve 105 and break valve 1056 in the IC pickup.

What is claimed is:

1. An IC pickup for an X-Y conveyor of an IC testing apparatus conveying an electronic component to a test head, testing the electronic component at the test head, and sorting the electronic component based on data from a result of the test, the IC pickup comprising:
   a pad for picking up and holding an electronic component by suction;
   an actuator comprised of a fluid pressure cylinder for making said pad operate; and
   a suction control valve for applying and releasing a suction force to and from said pad,
   wherein said pad, said actuator and said suction control valve are assembled into an integral block-shaped unit.

2. The IC pickup as set forth in claim 1, further comprising signal wires for said actuator, said suction control valve and said sensor are connected to a single location and are made internal wiring.

3. The IC pickup as set forth in claim 1, wherein a sensor for detecting the suction force of said pad is further assembled into the integral block-shaped unit.

4. The IC pickup as set forth in claim 1, wherein a suction force generator for imparting a suction force to said pad is further assembled into the block-shaped integral unit.

5. The IC pickup as set forth in claim 1, wherein said actuator is comprised of a fluid pressure cylinder and a cylinder control valve for controlling the drive of said fluid pressure cylinder is further assembled into the integral block-shaped unit.

6. The IC pickup as set forth in claim 5, wherein said fluid pressure cylinder is controlled by a differential pressure control circuit.

7. The IC pickup as set forth in claim 1, wherein the fluid pressure cylinder has a longitudinal axis which intersects the pad.

8. The IC pickup as set forth in claim 1, further comprising a mounting base on which the pad, the actuator and the suction control valve are mounted, the actuator and suction control valve being fixed relative to one another, the pad being mounted on a rod extending from the fluid pressure cylinder and being movable relative to the mounting base.

9. The IC pickup as set forth in claim 8, further comprising a second IC pickup device having a pad, an actuator and a suction control valve, the second IC pickup device being mounted on the mounting base.

10. An IC pickup for an X-Y conveyor of an IC testing apparatus conveying an electronic component to a test head, testing the electronic component at the test head, and sorting the electronic component based on data from a result of the test, the IC pickup comprising:
    a pad for picking up and holding an electronic component by suction;
    an actuator comprised of an electromagnetic cylinder for making said pad operate; and
    a suction control valve for applying and releasing a suction force to and from said pad,
    wherein said pad, said actuator and said suction control valve are assembled into an integral block-shaped unit.

11. The IC pickup as set forth in claim 10, further comprising signal wires for said actuator, said suction control valve and said sensor are connected to a single location and are made internal wiring.

12. The IC pickup as set forth in claim 10, wherein a sensor for detecting the suction force of said pad is further assembled into the integral block-shaped unit.

13. The IC pickup as set forth in claim 10, wherein the electromagnetic cylinder has a longitudinal axis which intersects the pad.

14. The IC pickup as set forth in claim 10, further comprising a mounting base on which the pad, the actuator and the suction control valve are mounted, the actuator and suction control valve being fixed relative to one another, the pad being mounted on a rod extending from the electromagnetic cylinder and being movable relative to the mounting base.

15. The IC pickup as set forth in claim 14, further comprising a second IC pickup device having another pad, another actuator and another suction control valve, the second IC pickup device being mounted on the mounting base.

* * * * *